(12) United States Patent
Chu et al.

(10) Patent No.: US 6,764,930 B2
(45) Date of Patent: Jul. 20, 2004

(54) METHOD AND STRUCTURE FOR MODULAR, HIGHLY LINEAR MOS CAPACITORS USING NITROGEN IMPLANTATION

(75) Inventors: Jerome Tsu-Rong Chu, Orlando, FL (US); Sidhartha Sen, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/964,227

(22) Filed: Sep. 26, 2001

(65) Prior Publication Data

US 2003/0057465 A1 Mar. 27, 2003

(51) Int. Cl.[7] .............................. H01L 21/425
(52) U.S. Cl. .................... 438/528; 438/264; 438/594; 438/766
(58) Field of Search ................ 438/264, 528, 438/594, 766

(56) References Cited

U.S. PATENT DOCUMENTS

| 5,236,573 A | * | 8/1993 | Shannon | 205/122 |
| 5,750,428 A | * | 5/1998 | Chang | 438/264 |
| 5,854,114 A | * | 12/1998 | Li et al. | 438/296 |
| 5,904,575 A | * | 5/1999 | Ishida et al. | 438/770 |
| 5,942,780 A | * | 8/1999 | Barsan et al. | 257/321 |
| 6,093,946 A | * | 7/2000 | Li et al. | 257/318 |
| 6,255,169 B1 | * | 7/2001 | Li et al. | 438/264 |
| 2002/0190310 A1 | * | 12/2002 | Bolvin | 257/318 |

* cited by examiner

Primary Examiner—Amir Zarabian
Assistant Examiner—Jeff Vockrodt
(74) Attorney, Agent, or Firm—Ferdinand Romano

(57) ABSTRACT

A metal oxide semiconductor (MOS) capacitor formed according to a process in which Fermi level enhanced oxidation is suppressed by the introduction of nitrogen impurities into an N-doped impurity region is formed to utilize the N-doped impurity region as a lower electrode and includes a capacitor dielectric having a reduced thickness with respect to other portions of the thermal oxide film formed over N-doped impurity regions. The capacitor is highly linear and includes a high capacitance density. The process used to form the capacitor includes thermally oxidizing a substrate such that an oxide film is formed to include multiple thicknesses including an enhanced oxide growth rate producing an oxide film of increased thickness in N-doped impurity regions and a section within nitrogen-doped impurity portions of the N-doped impurity region in which the enhanced oxidation growth is suppressed and the film formed in this region includes a desirably reduced thickness.

21 Claims, 2 Drawing Sheets

METHOD AND STRUCTURE FOR MODULAR, HIGHLY LINEAR MOS CAPACITORS USING NITROGEN IMPLANTATION

FIELD OF THE INVENTION

The present invention relates, most generally, to semiconductor devices and methods for forming the same. More particularly, the present invention relates to highly linear MOS capacitors and a method for forming the same which utilizes nitrogen implantation.

BACKGROUND OF THE INVENTION

MOS (metal oxide semiconductor) capacitors are formed in silicon substrates and typically utilize a highly doped section of the silicon substrate as a lower capacitor electrode. In order to minimize fabrication time and costs, it is generally desirable to minimize the number of processing operations used in forming a particular semiconductor structure, as well as the completed, integrated circuit device. As such, the capacitor dielectric for MOS capacitors is commonly formed over the lower electrode during a thermal oxidation process used to simultaneously form gate oxides in transistor regions on the same substrate. When highly N-doped silicon substrate regions are used to form lower electrodes for MOS capacitors, however, Fermi level oxidation enhancement causes the thermal oxide thickness formed over the lower electrode to increase greatly with respect to the gate oxide being simultaneously formed on an undoped region of the same silicon substrate. This thermal oxide of increased thickness will serve as the capacitor dielectric and such a capacitor dielectric of increased thickness drastically and undesirably reduces capacitance density when measured per unit of silicon surface area.

What is needed, therefore, is a method which utilizes N-doped regions of silicon substrates to make linear MOS capacitors but which suppresses the undesirable enhanced oxide growth in the N-doped silicon regions.

SUMMARY OF THE INVENTION

To achieve these and other objects, and in view of its purposes, the present invention addresses the shortcomings of the metal oxide semiconductor (MOS) capacitor formation processes and structures known to the prior art and provides a method for utilizing highly N-doped regions of silicon substrates as lower electrodes of capacitors, while suppressing Fermi level oxidation enhancement of the N-doped regions. The present invention describes materials, processes, and structures used to produce linear MOS capacitors having high capacitance densities and which utilize portions of an N-doped silicon substrate as a lower capacitor electrode.

The present invention provides for introducing nitrogen into the highly N-doped silicon region which is to be used as the lower capacitor electrode. The semiconductor substrate is then thermally oxidized to form an oxide film on the semiconductor surface including within the N-doped region. The presence of nitrogen in the N-doped region suppresses the enhanced growth of the thermal oxide film formed to serve as the capacitor dielectric. The oxide film includes a thickness in the nitrogen region which is less than the thickness of the same oxide film simultaneously formed in other regions of the N-doped regions. The N-doped region in which nitrogen is introduced, serves as the lower electrode of the capacitor formed. The introduction of nitrogen also maintains the resistance of the highly N-doped silicon electrode at a low value, which reduces the effect of voltage on the capacitance and thereby produces a linear capacitor. The method and structure of the present invention is easily integrable into conventional processing sequences used to form semiconductor devices.

BRIEF DESCRIPTION OF THE DRAWING

The present invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Like numerals denote like features throughout the specification and drawing. Included in the drawing are the following figures, each of which is a cross-sectional view:

FIGS. 1–5 show an exemplary process sequence used for forming one exemplary embodiment of a capacitor according to the present invention, and FIGS. 6–8 show another exemplary process sequence used to form another exemplary embodiment of a capacitor according to the present invention.

DETAILED DESCRIPTION OF THE INVENTION

Figure 1:
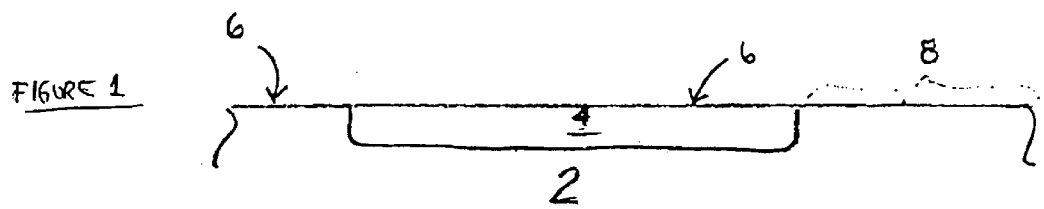
FIG. 1 shows an N-doped impurity region formed within a semiconductor substrate.

The materials, structures, and processes of the present invention are best described in conjunction with the drawing. The present invention provides materials, structures, and processes for forming linear MOS capacitors in semiconductor substrates and utilizing N-doped impurity regions formed within the substrate as lower capacitor electrodes. A portion of the N-doped impurity region over which the capacitor dielectric and upper electrode will be formed has nitrogen introduced therein before the capacitor dielectric film is formed by thermally oxidizing the substrate. Fermi level oxidation enhancement effects within the N-doped impurity regions are suppressed due to the presence of nitrogen and the thermal oxidation process used to form the capacitor dielectric includes the oxide film having a reduced thickness in the nitrogen-doped capacitor area relative to other areas of the N-doped impurity regions. The thickness of the oxide film in the nitrogen-doped capacitor region is substantially similar to the thickness of the oxide film formed in bulk, undoped portions of the semiconductor substrate during the thermal oxidation process. The size of the capacitor formed and specifically of the lower capacitor electrode will vary according to the various exemplary embodiments. Multiple N-doped impurity regions may be formed in a substrate and one, some, or all of the N-doped impurity regions may include a capacitor or capacitors of the present invention formed therein.

Now referring to the figures, FIG. 1 shows semiconductor substrate 2 having an N-doped impurity region 4 formed within surface 6 of semiconductor substrate 2. Semiconductor substrate 2 may be a silicon wafer according to the preferred embodiment. According to another exemplary embodiment, semiconductor substrate 2 may include an upper silicon layer or portion formed over a base substrate formed of other materials. N-doped impurity region 4 may include phosphorous, arsenic, or other N-type species as the dopant impurity. N-doped impurity region 4 may include an N-type impurity dopant concentration within the range of $10^{18}/cm^3$ to $10^{19}1/cm^3$, but other dopant concentrations may be used according to alternative embodiments. Conventional methods for forming N-doped impurity region 4, such as ion implantation and diffusion, may be used. Semiconductor substrate 2 also includes undoped, bulk portions 8, which do not include dopant impurities. The lateral size and depth of N-doped impurity region 4 will vary according to the various exemplary embodiments. According to an exemplary embodiment, N-doped impurity region 4 may be formed along with similar N-doped impurity regions to be used as N-tub or N-well regions conventionally used in semiconductor device formation.

Figure 2:
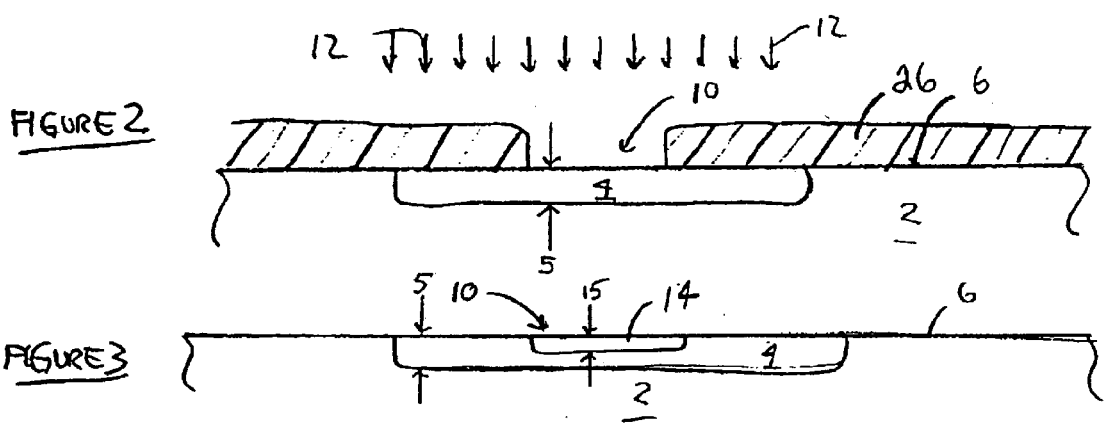
FIG. 2 shows nitrogen impurities being introduced into a portion of the N-doped impurity region shown in FIG. 1.

Now turning to FIG. 2, masking film 26 is formed over surface 6 of semiconductor substrate 2. Masking film 26 is patterned to include an opening which defines capacitor region 10. In the preferred embodiment, masking film 26 may be a photosensitive material, such as a commercially-available photoresist, but other materials may be used alternatively. Masking film 26 may be formed over surface 6 and patterned, using conventional technology. Capacitor region 10 is the area in which nitrogen will be introduced and over which a capacitor dielectric and upper capacitor electrode will be formed. After masking film 26 is patterned, nitrogen is introduced into capacitor region 10. According to one exemplary embodiment, nitrogen may be introduced into capacitor region 10 by conventional ion implantation processes. Arrows 12 represent an ion implantation process used to introduce nitrogen atoms into capacitor region 10. Conventional low energy processes may be used. The parameters of the nitrogen ion implantation process are controlled so that the depth of the nitrogen impurity region preferably does not exceed depth 5 of N-doped impurity region 4 which may vary according to various exemplary embodiments. The ion implantation process may include an implant energy within the range of 5 to 9 keV and in the preferred embodiment may be 7 keV. An implant dosage may lie within the range of $10^{14}/cm^2$ to $10^{15}/cm^2$ in an exemplary embodiment, but other implant dosages may be used alternatively. According to other exemplary embodiments, nitrogen may be introduced into capacitor region 10 by other means, such as by diffusion. In an exemplary embodiment, the lateral dimensions of capacitor region 10 within substrate surface 6 may range from 2 to 100 microns in length. In an exemplary embodiment, capacitor region 10 may be generally rectangular in shape as formed on substrate surface 6. The opposed sides of the rectangular capacitor region 10 may range from 2 to 100 microns in length, depending on the capacitance sought.

Figure 3:
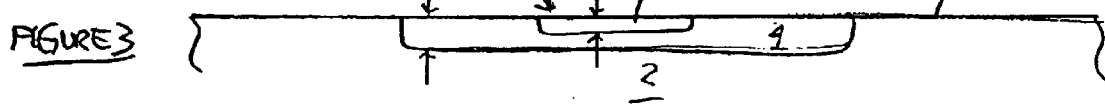
FIG. 3 shows a nitrogen impurity region formed in the N-doped impurity region.

FIG. 3 shows nitrogen impurity region 14 formed within N-doped impurity region 4 in semiconductor substrate 2. Nitrogen impurity region 14 is formed within capacitor region 10. Nitrogen impurity region 14 includes depth 15, which is illustrated to be significantly less than depth 5 of N-doped impurity region 4, but this is exemplary only and depth 15 may approach or equal depth 5 according to other exemplary embodiments. Furthermore, while the lateral dimension of nitrogen impurity region 14 and therefore capacitor region 10 are shown to be small with respect to the lateral dimension of N-doped impurity region 4, it should be understood that this, too, is exemplary only and that the lateral dimensions of nitrogen impurity region 14 and N-doped impurity region 4 may be substantially the same. This will be shown in the exemplary process sequence illustrated in FIGS. 6–8 below. Nitrogen impurity region 14 may include a nitrogen density within the range of $10^{17}–10^{19}/cm^3$, but other densities may be used alternatively. The structure shown in FIG. 3 will then be thermally oxidized to produce a thermal oxide film having multiple thicknesses as will be shown in FIG. 4. Now turning to FIG. 4, a thermal oxidation process is carried out to form an oxide film on surface 6 of semiconductor substrate 2. The thermal oxidation process may be an oxidation process carried out using rapid thermal anneal (RTA) principles and within a commercially available RTA apparatus. According to another exemplary embodiment, the oxidation process may take place in an oxidation furnace. According to one exemplary embodiment, the furnace oxidation process may take place at a temperature ranging from 750° C. to 950° C., and for a time ranging from 5 to 15 minutes. Other oxidation process parameters may be used alternatively. The oxidation process parameters will vary depending on the thickness of the capacitor dielectric desired. The thermal oxidation process may also be used to simultaneously form transistor gate oxides in other portions of semiconductor substrate 2. In the preferred embodiment in which semiconductor substrate 2 is a silicon substrate, the thermal oxidation process forms a silicon dioxide film.

During this thermal oxidation process, a film is formed to have multiple thicknesses. Thermal oxide film 16 is formed to include thickness 23 in portion 22, thickness 21 in portion 20, and thickness 19 in portion 18. Portion 22 of thermal oxide film 16 is a portion of thermal oxide film 16 formed over the bulk, undoped areas 8 of semiconductor substrate 2. Due to Fermi level oxidation enhancement, portion 20 of thermal oxide film 16 formed within N-doped impurity region 4 includes thickness 21, which is greater than thickness 23 due to the enhanced growth of thermal oxide film 16 in this region. In capacitor region 10 and over nitrogen impurity region 14, portion 18 of thermal oxide film 16 includes thickness 19, which is less than thickness 21 because the nitrogen suppresses the enhanced Fermi level oxide growth otherwise manifested in portions of N-doped impurity region 4 which are not additionally doped with nitrogen. Portion 18 of thermal oxide film 16 includes nitrogen therein. The suppression of enhanced oxide growth may be such that thickness 19 of portion 18 is less than 50% of thickness 21 of portion 20, but other relative thicknesses may be produced according to other exemplary embodiments. Thickness 23 of portion 22 may likewise be less than 50% of thickness 21 of portion 20, and thickness 23 of portion 22 may be substantially equal to thickness 19 of portion 18 of thermal oxide film 16. According to another exemplary embodiment, thickness 21 of portion 20 may exceed thickness 19 of portion 18 by at least 80%. According to an exemplary embodiment, thickness 23 of portion 22 formed on undoped, bulk portion 8 of semiconductor substrate 2 may be approximately 40–60 angstroms and thickness 19 of portion 18 formed in capacitor region 10 may be approximately 40–60 angstroms, whereas thickness 21 of portion 20 may range from 80 –150 angstroms. In an exemplary embodiment, each of thickness 19 and thickness 23 may be less than 55 angstroms. Various other absolute and relative thicknesses of portions 18, 20 and 22 of thermal oxide film 16, may be produced according to other exemplary embodiments. Portion 18 of thermal oxide film 16 will serve as a capacitor dielectric in capacitor region 10, as will be shown in FIG. 5.

Figure 5:
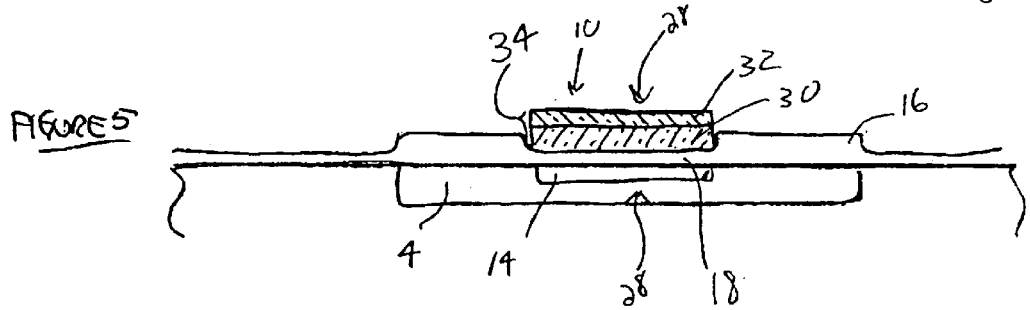
FIG. 5 shows an exemplary capacitor formed over the structure shown in FIG. 4.

Now turning to FIG. 5, capacitor 28 is formed within capacitor region 10 and over nitrogen impurity region 14. Capacitor 28 includes upper electrode 34, which is a composite film according to the exemplary embodiment. According to the exemplary embodiment, upper electrode 34 may include film 30, which may be a doped polysilicon film according to an exemplary embodiment, and film 32 which may be a silicide film according to an exemplary embodiment. Various silicide films may be used. According to other exemplary embodiments, films 30 and 32 may be formed of other materials suitable for use as a capacitor electrode, and according to still another exemplary embodiment, upper electrode 34 may be formed of a single film. Conventional materials and methods for forming and patterning upper capacitor electrode 34, may be used. While the area of capacitor 28 is understood to be the lateral dimensions of upper electrode 34 shown only in cross-section in FIG. 5, the lower electrode of the capacitor may be considered to be N-doped impurity region 4, including nitrogen impurity region 14 formed within capacitor region 10. According to an exemplary embodiment, capacitor 28 may subsequently have regions of oxide film 16, which lie outside of capacitor region 10, removed using conventional means. After this optional process operation (not shown), the only portion of dielectric film 16 which remains, is portion 18 in capacitor region 10.

Figure 8:
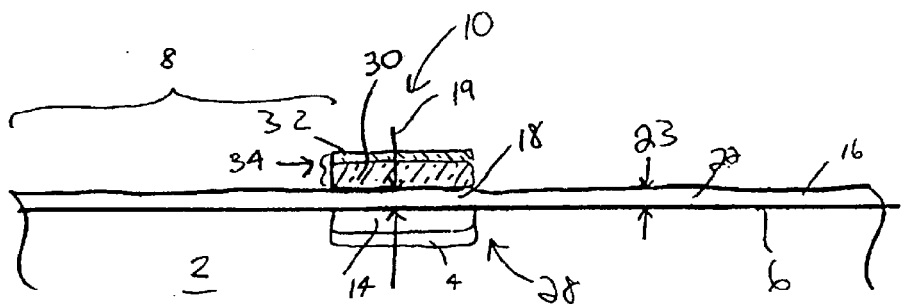
FIG. 8 shows another exemplary capacitor formed over the structure shown in FIG. 7.

FIGS. 1–5 show an exemplary process sequence used to form a capacitor region within a portion of an N-doped impurity region. It should be understood that substrate 2 may include multiple N-doped impurity regions 4 and that capacitor 28 may be formed in portions of some or all other N-doped impurity regions 4. Moreover, according to another exemplary embodiment, capacitor region 10, and therefore nitrogen impurity region 14, may be formed to be substantially the same size as N-doped impurity region 4. This exemplary embodiment is illustrated in FIGS. 6–8.

Figure 6:
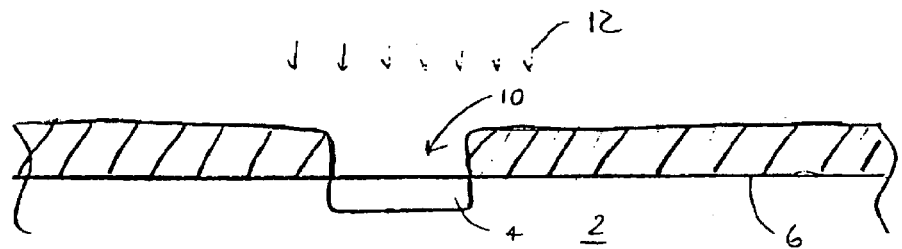
FIG. 6 shows nitrogen impurities being introduced into another exemplary N-doped impurity region.

In FIG. 6, capacitor region 10 into which nitrogen impurity atoms are introduced, preferably by ion implantation as indicated by arrows 12, has substantially the same lateral dimensions as N-doped impurity region 4. Other methods for introducing nitrogen into capacitor region 10, may be used alternatively. It should be understood that in the cross-sectional view shown, only one component of the coincident lateral dimensions of N-doped impurity region 4 and capacitor region 10, is shown. In an exemplary embodiment, capacitor region 10 and N-doped impurity region 4 may be substantially the same size and shape with respect to each of their lateral dimensions as formed on surface 6 of substrate 2.

Figure 4:
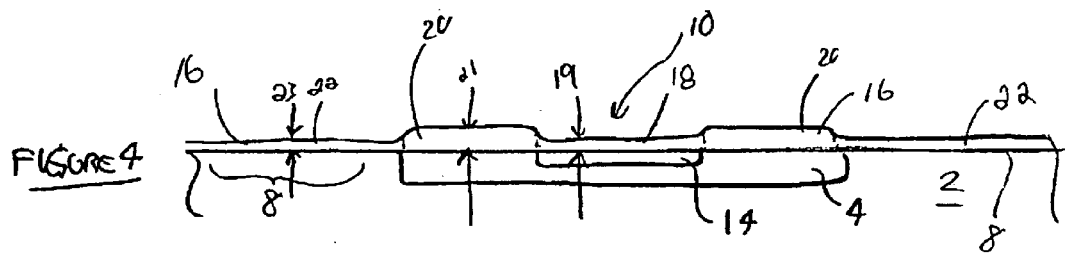
FIG. 4 shows a thermal oxide film having multiple thicknesses formed over the structure shown in FIG. 3.
Figure 7:
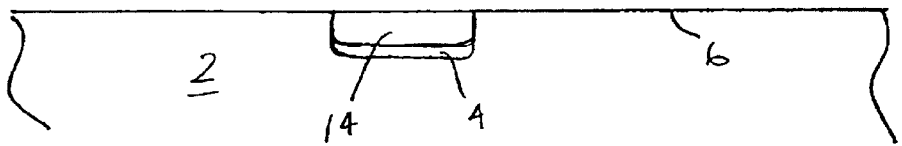
FIG. 7 shows another exemplary embodiment of a nitrogen region formed within an N-doped impurity region.

Now referring to FIG. 7, nitrogen impurity region 14 is formed within N-doped impurity region 4 and includes substantially the same lateral dimensions. The structure shown in FIG. 7 is then subjected to a thermal oxidation process as described in conjunction with FIG. 4, above. FIG. 8 shows thermal oxide film 16 formed over substrate surface 6. In the exemplary embodiment illustrated in FIG. 8, only portion 18 and portion 22 of thermal oxide film 16 are shown. Thickness 19 of portion 18 and thickness 23 of portion 22 are substantially the same. Portion 18 of thermal oxide film 16 includes some nitrogen therein. This is due to the suppression of the enhanced Fermi oxidation effects which otherwise would take place in portions of N-doped impurity region 4 not additionally doped with nitrogen. During the thermal oxidation process used to form thermal oxide film 16, other portions of N-doped impurity region 4 not additionally doped with nitrogen, would include an increased oxide thickness such as thickness 21 of portion 20 as shown in FIG. 4. Returning to FIG. 8, MOS capacitor 28 includes a lower electrode formed of N-doped impurity region 4 including nitrogen impurity region 14, a capacitor dielectric formed of portion 18 of thermal oxide film 16, and upper electrode 34. The structure shown in FIG. 8 may subsequently have portions of dielectric film 16, which lie outside capacitor region 10, removed using any of various suitable conventional means, such that only portion 18 of dielectric film 16, remains (not shown).

According to various exemplary embodiments, several N-doped impurity regions may be formed on the substrate surface. The N-doped impurity regions may take on different sizes and shapes and serve various functions. Nitrogen may be introduced into one or many of the N-doped impurity regions. In some of the N-doped impurity regions, the nitrogen region may be the same size as the N-doped impurity region and in others, the nitrogen region will be contained within the N-doped impurity region. When the substrate is thermally oxidized, the above-described principles control, and Fermi-level oxidation enhancement takes place in N-doped regions while the Fermi-level enhancement of the oxide growth in N-doped regions is suppressed in N-doped regions which additionally include nitrogen.

In each of the illustrated and other exemplary embodiments of MOS capacitors formed according to the present invention, the capacitor is formed to include a high capacitance density compared to a capacitor formed over an N-type impurity region which does not include nitrogen introduced therein. The capacitance density may be greater than 7 fF/$\mu$m$^2$ in an exemplary embodiment. The formed capacitor is also highly linear and may include a linearity defined as [($\Delta$C/C)(1V)<1%], in a preferred embodiment.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A process for integrating a linear MOS capacitor in a semiconductor product, comprising the steps of:
   providing a semiconductor substrate having a semiconductor surface;
   introducing N-type dopant impurities into said semiconductor surface, thereby forming N-doped regions within said semiconductor surface;
   introducing nitrogen into at least one of said N-doped regions to form at least one capacitor region; and,
   thermally oxidizing said substrate surface to form an oxide film on said semiconductor surface, said oxide film having a first thickness in said at least one capacitor region and a second thickness being greater than said first thickness in other portions of said N-doped regions; and
   forming said linear MOS capacitor by forming a top capacitor plate over each capacitor region.

2. The process as in claim 1, in which said forming a top capacitor plate comprises forming one of a conductive material and a semiconductor material.

3. The process as in claim 1, in which said step of introducing nitrogen comprises ion implantation.

4. The process as in claim 3, in which said step of introducing nitrogen includes an implant energy within the range of 5–9 keV and an implant dosage which lies within the range of $10^{14}/cm^2$ to $10^{15}/cm^2$.

5. The process as in claim 1, in which said step of thermally oxidizing includes forming said oxide film having said first thickness being less than 50% of said second thickness.

6. The process as in claim 1, in which said first thickness is less than 55 angstroms and said second thickness lies within the range of 80 –150 angstroms.

7. The process as in claim 1, in which said step of introducing N-type dopant impurities includes forming said N-doped regions to include an N-type impurity concentration which lies within the range of $10^{18}/cm^3$ to $10^{19}/cm^3$.

8. The process as in claim 1, in which said capacitor region includes a nitrogen density within the range of $10^{17}$ to $10^{19}/cm^3$.

9. The process as in claim 1, in which semiconductor surface regions in which said N-type dopant impurities are not introduced, are designated undoped regions, and said step of thermally oxidizing includes forming said oxide film having a third thickness in said undoped regions, said third thickness being less than 50% of said second thickness.

10. The process as in claim 1, further comprising the step of defining said at least one capacitor region prior to said step of introducing nitrogen, said defining comprising forming a masking pattern in a photosensitive material.

11. The process as in claim 10, in which said masking pattern includes each capacitor region forming a lower capacitor electrode, having a rectangular shape and including sides ranging from 2 to 100 microns in length.

12. The process as in claim 1, wherein said thermally oxidizing comprises furnace oxidation at a temperature ranging from 750° C. to 950° C., for a time ranging from 5 to 15 minutes.

13. The process as in claim 1, wherein said N-type dopant impurity comprises one of phosphorous and arsenic.

14. The process as in claim 1, in which said step of introducing nitrogen comprises introducing nitrogen into at least one entire N-doped region of said N-doped regions.

15. The process as in claim 1, in which said step of introducing nitrogen includes introducing nitrogen into a first portion of a designated N-doped region, a second portion of said designated N-doped region not having nitrogen introduced therein.

16. The process as in claim 1, wherein said semiconductor substrate comprises silicon and said oxide film comprises silicon dioxide.

17. The process as in claim 1, wherein said thermally oxidizing comprises forming said oxide film such that said second thickness is greater than said first thickness by at least 80%.

18. The process as in claim 17, in which said step of thermally oxidizing includes forming said oxide film having a third thickness in undoped regions of said silicon surface, said third thickness and said first thickness being substantially equal.

19. A process for forming a semiconductor product, comprising the steps of:

providing a semiconductor substrate having a semiconductor surface;

introducing N-type dopant impurities into said semiconductor surface, thereby forming N-doped regions within said semiconductor surface;

defining at least one nitrogen region within at least one of said N-doped regions by forming a masking pattern in a photosensitive material, each nitrogen region having a rectangular shape and including sides ranging from 2 to 100 microns in length;

introducing nitrogen into said at least one nitrogen region, each nitrogen region forming a lower capacitor electrode; and, thermally oxidizing said substrate surface to form an oxide film on said semiconductor surface, said oxide film having a first thickness in said at least one nitrogen region and a second thickness being greater than said first thickness in other portions of said N-doped regions.

20. A process for forming a semiconductor product, comprising the steps of:

providing a semiconductor substrate having a semiconductor surface;

introducing N-type dopant impurities into said semiconductor surface, thereby forming N-doped regions within said semiconductor surface;

introducing nitrogen into at least one entire N-doped region of said N-doped regions to form at least one nitrogen region; and, thermally oxidizing said substrate surface to form an oxide film on said semiconductor surface, said oxide film having a first thickness in said at least one nitrogen region and a second thickness being greater than said first thickness in other portions of said N-doped regions.

21. The process as in claim 20, wherein said semiconductor product comprises a Metal Oxide Semiconductor (MOS) capacitor, and further comprising forming a top capacitor plate of at least one of a conductive material and a semiconductor material over said at least one nitrogen region.

* * * * *